(12) United States Patent
Hong et al.

(10) Patent No.: US 10,930,239 B2
(45) Date of Patent: Feb. 23, 2021

(54) GATE DRIVING CIRCUIT AND DISPLAY APPARATUS USING THE SAME

(71) Applicant: AU Optronics Corporation, Hsin-Chu (TW)

(72) Inventors: Kai-Wei Hong, Hsin-Chu (TW);
Chun-Da Tu, Hsin-Chu (TW);
Ming-Hsien Lee, Hsin-Chu (TW);
Chuang-Cheng Yang, Hsin-Chu (TW);
Yi-Cheng Lin, Hsin-Chu (TW);
Chun-Feng Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/690,606

(22) Filed: Nov. 21, 2019

(65) Prior Publication Data
US 2020/0090614 A1 Mar. 19, 2020

Related U.S. Application Data

(62) Division of application No. 15/953,720, filed on Apr. 16, 2018, now Pat. No. 10,522,105.

(30) Foreign Application Priority Data

Apr. 28, 2017 (TW) .............................. 106114191 A

(51) Int. Cl.
*G11C 19/00* (2006.01)
*G09G 3/36* (2006.01)
(Continued)

(52) U.S. Cl.
CPC ............. *G09G 3/3677* (2013.01); *G09G 3/20* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS 7,400,698 B2 * 7/2008 Chang .................... G11C 19/28
377/64
8,218,713 B2 * 7/2012 Hsu ........................ G11C 19/28
377/64
(Continued)

*Primary Examiner* — Tuan T Lam
(74) *Attorney, Agent, or Firm* — WPAT, PC

(57) ABSTRACT

The present embodiment of the invention provides a gate driving circuit and a display apparatus using the gate driving circuit. The gate driving circuit has a plurality of shift registers, and each shift register includes a first output unit, a first pull-down unit, a second output unit, a second pull-down unit, a voltage coupling unit, and a voltage boosting unit. The first output unit is coupled to a node and a first output end. The second output unit is coupled to the node and a second output end. The first pull-down unit is coupled to the first output end and a reference potential. The second pull-down unit is coupled to the second output end and the reference potential. The voltage coupling unit is coupled between the node and the second output end. The voltage boosting unit is coupled to a preset potential, the first output end, and a node and a gate high potential of a shift register at a previous stage.

7 Claims, 11 Drawing Sheets

(51) Int. Cl.
*G11C 19/28* (2006.01)
*G09G 3/20* (2006.01)
(52) U.S. Cl.
CPC ............ *G09G 2310/0267* (2013.01); *G09G 2310/0286* (2013.01); *G09G 2310/0289* (2013.01); *G09G 2310/06* (2013.01)

(56) References Cited

U.S. PATENT DOCUMENTS

| | | | | |
|---|---|---|---|---|
| 8,422,620 | B2* | 4/2013 | Su | G11C 19/28 377/64 |
| 8,971,479 | B2* | 3/2015 | Chang | G11C 19/28 377/64 |
| 2011/0007863 | A1* | 1/2011 | Tsai | G11C 19/28 377/79 |
| 2014/0010341 | A1* | 1/2014 | Wu | G11C 19/00 377/78 |
| 2016/0019828 | A1* | 1/2016 | Lin | G09G 3/20 345/214 |
| 2019/0096308 | A1* | 3/2019 | Lv | G09G 3/20 |

\* cited by examiner

GATE DRIVING CIRCUIT AND DISPLAY APPARATUS USING THE SAME

CROSS-REFERENCE TO RELATED APPLICATION

This application is a continuation of U.S. patent application Ser. No. 15/953,720, filed on Apr. 16, 2018 which is incorporated by reference herein in its entirety.

BACKGROUND

Technical Field

The present disclosure relates to the display, and in particular, to a gate driving circuit and a display apparatus using the gate driving circuit.

Related Art

Generally, a gate driving circuit in a display includes a shift register having a plurality of stages that are connected in series. A shift register at each stage is configured to output a gate driving signal and enable a corresponding pixel row by using the gate driving signal, so that required display data can be written into each pixel in the pixel row.

However, a circuit architecture of a conventional shift register cannot support an operation of a high frame rate and cannot be used in a low temperature environment. A reason lies in that under the foregoing two operation conditions, a shift register needs to provide pixels in a display apparatus with a gate driving signal having a voltage difference high enough, so as to fit with a high reaction speed of liquid crystal under the operation condition of the high frame rate and provide temperature compensation under the operation condition of the low temperature environment according to the above to make an operation of a gate driving circuit stable. However, when a conventional shift register outputs a gate driving signal having a voltage difference high enough, a gate-source of a driving transistor thereof bears an excessively high cross voltage (for example, 19 V), causing breakdown of the driving transistor due to an excessively large current that passes by. Consequently, functions of the shift register are disabled. Therefore, how to effectively resolve the problem is an important issue.

SUMMARY

The embodiment of the present invention provides a gate driving circuit, the gate driving circuit comprises a shift register having a plurality of stages connected in series, wherein the shift register at each stage respectively comprises a first output end and a second output end. The shift register at each stage receives a clock signal, a reference potential, a preset potential, and a gate high potential, the first output end generates a gate driving signal, and the second output end generates a scanning signal. The shift register at each stage comprises: a first output unit, a first pull-down unit, a second output unit, a second pull-down unit, a voltage coupling unit, and a voltage boosting unit. The first output unit is respectively electrically coupled to a node and the first output end, receives the clock signal, and outputs the gate driving signal according to the node and the clock signal. The first pull-down unit is respectively electrically coupled to the first output end and receives the reference potential. The second output unit is respectively electrically coupled to the node and the second output end, receives the clock signal, and outputs the scanning signal according to the node and the clock signal. The second pull-down unit is respectively electrically coupled to the second output end and the reference potential. The voltage coupling unit is respectively electrically coupled between the node and the second output end. The voltage boosting unit is respectively electrically coupled to the preset potential, the first output end, and the node and the gate high potential of a shift register at a previous stage, wherein during a voltage level change period of the node of the shift register at the previous stage, the level of the gate driving signal pulls up from the reference potential to the preset potential, and the preset potential is lower than the gate high potential.

The embodiment of the present invention further provides another gate driving circuit, the gate driving circuit comprises a shift register having a plurality of stages connected in series, wherein the shift register at each stage respectively comprises a first output end and a second output end. The shift register at each stage receives a clock signal, a reference potential, a preset potential, and a gate high potential, the first output end is capable of generating a gate driving signal, and the second output end is capable of generating a scanning signal. The shift register at each stage comprises: a first output unit, a first pull-down unit, a second output unit, a second pull-down unit, a voltage coupling unit, and a voltage boosting unit. The first output unit is respectively electrically coupled to a node and the first output end, receives the clock signal, and outputs the gate driving signal according to the node and the clock signal. The first pull-down unit is respectively electrically coupled to the first output end and receives the reference potential. The second output unit is respectively electrically coupled to the node and the second output end, receives the clock signal, and outputs the scanning signal according to the node and the clock signal. The second pull-down unit is respectively electrically coupled to the second output end and the reference potential. The voltage coupling unit is respectively electrically coupled between the node and the second output end. The voltage boosting unit is respectively electrically coupled to the preset potential, the first output end, and the second output end and the gate high potential of a shift register at a previous stage, wherein during a voltage level change period of the scanning signal outputted by the shift register at the previous stage, the level of the gate driving signal pulls up from the reference potential to the preset potential, and the preset potential is lower than the gate high potential.

The embodiment of the present invention further provides still another gate driving circuit, wherein the gate driving circuit comprises a shift register having a plurality of stages that are connected in series, a shift register at each stage respectively comprises an output end and generates a gate driving signal, and the shift register at each stage receives a clock signal, a reference potential, a preset potential, and a gate high potential. The shift register at each stage comprises: an output unit, a pull-down unit, a voltage coupling unit, and a voltage boosting unit. The output unit is respectively electrically coupled to a node and the output end, receives the clock signal, and outputs the gate driving signal from the output end according to the node and the clock signal. The pull-down unit is respectively electrically coupled to the output end and receives the reference potential. The voltage coupling unit is respectively electrically coupled between the node and the output end. The voltage boosting unit is respectively electrically coupled to the preset potential, the output end, and a node of a shift register at a previous stage, wherein during a voltage level change period of the node of the shift register at the previous stage, the level of the gate driving signal pulls up from the reference potential to the preset potential, and the preset potential is lower than the gate high potential.

The embodiment of the present invention further provides a display apparatus, where the display apparatus comprises an active area and a surrounding area. The active area has a plurality of gate lines and a plurality of data lines, wherein the gate lines are staggered with the data lines to form a plurality of pixel units. The surrounding area is disposed at one side of the active area and has a gate driving circuit. The gate driving circuit is respectively electrically coupled to the gate lines, and the gate driving circuit comprises a shift register having a plurality of stages that are connected in series. A shift register at each stage respectively comprises: a first output end, a primary output circuit, a voltage boosting circuit, a first clock signal, a gate high potential, a reference potential, and a preset potential. The first output end is for generating a gate driving signal to one of the gate lines. The second output end is for generating a scanning signal to a shift register at a previous stage or a next stage. The primary output circuit is electrically coupled to the second output end. The voltage boosting circuit is electrically coupled to the first output end. The first clock signal and the gate high potential are both respectively electrically coupled to the primary output circuit and the voltage boosting circuit. The reference potential is electrically coupled to the primary output circuit. The preset potential is electrically coupled to the voltage boosting circuit, wherein the preset potential is higher than the reference potential, and the preset potential is lower than the gate high potential. The level of the gate driving signal is stepped up from the reference potential to the preset potential, and then from the preset potential to the gate high potential.

In order to make the aforementioned and other objectives, features, and advantages of the present invention comprehensible, preferred embodiments accompanied with figures are described in detail below.

DETAILED DESCRIPTION

A gate driving circuit of the present invention includes a shift register having a plurality of stages that are connected in series. An implementation manner of a shift register at each stage is described in the following, and the following embodiments are all described by using a shift register at an $n^{th}$ stage as an example.

Figure 1:
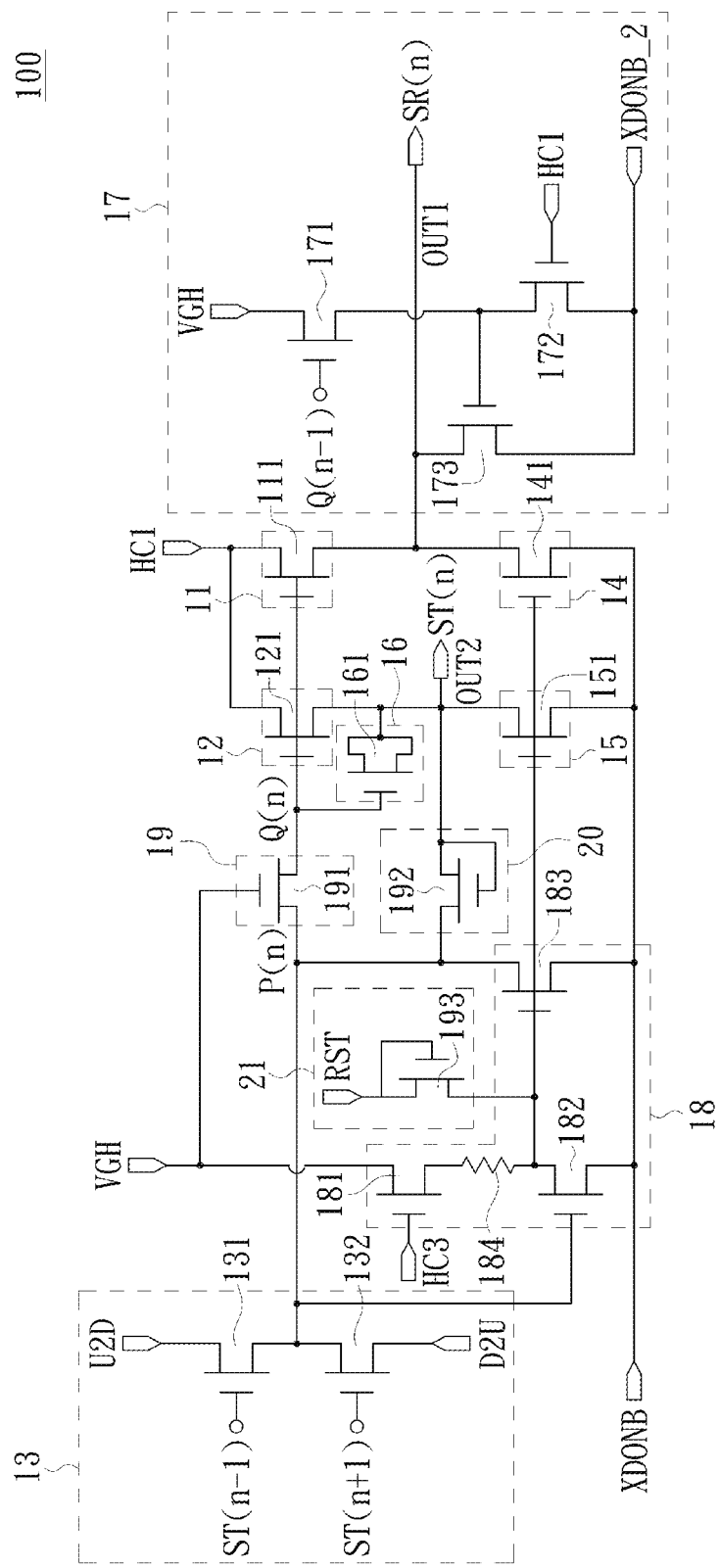
FIG. 1 is a circuit diagram of a shift register according to a first embodiment of the present invention.

Referring to FIG. 1, FIG. 1 is a circuit diagram of a shift register 100 according to a first embodiment of the present invention. As shown in FIG. 1, the shift register 100 includes an output unit 11, an output unit 12, an input signal selection unit 13, a pull-down unit 14, a pull-down unit 15, a voltage coupling unit 16, a voltage boosting unit 17, a voltage stabilization unit 18, a switch unit 19, an electricity leakage preventing unit 20, and a resetting unit 21. The output unit 11 is electrically coupled to a node Q(n) and an output end OUT1, receives a clock signal HC1, and is configured to output a gate driving signal SR(n) according to the node Q(n) and the clock signal HC1. The output unit 12 is electrically coupled to the node Q(n) and an output end OUT2, receives the clock signal HC1, and is configured to output a scanning signal ST(n) according to the node Q(n) and the clock signal HC1.

The input signal selection unit 13 is electrically coupled to a node P(n), a scanning signal ST(n−1) outputted by a shift register at an $(n-1)^{th}$ stage, a scanning signal ST(n+1) outputted by a shift register at an $(n+1)^{th}$ stage, a high-level voltage U2D, and a low-level voltage D2U. The input signal selection unit 13 is configured to determine, according to the scanning signal ST(n−1), whether the node P(n) is electrically coupled to the high-level voltage U2D and is configured to determine, according to the scanning signal ST(n+1), whether the node P(n) is electrically coupled to the low-level voltage D2U. The pull-down unit 14 is electrically coupled to the output end OUT1 and receives a reference potential XDONB. The pull-down unit 15 is electrically coupled to the output end OUT2 and receives the reference potential XDONB.

The voltage coupling unit 16 is electrically coupled between the node Q(n) and the output end OUT2. The voltage boosting unit 17 is electrically coupled to a preset potential XDONB_2, the output end OUT1, and a node Q(n−1) and a gate high potential VGH of the shift register at the $(n-1)^{th}$ stage, and is configured to, during a voltage level change period of the node Q(n−1) of the shift register at the $(n-1)^{th}$ stage, pull up the level of the gate driving signal SR(n) from the reference potential XDONB to the preset potential XDONB_2. The preset potential XDONB_2 is lower than the gate high potential VGH.

The voltage stabilization unit 18 is electrically coupled to the input signal selection unit 13, the gate high potential VGH, a clock signal HC3, and the reference potential XDONB. The voltage stabilization unit 18 is configured to determine, according to the clock signal HC3, whether the node P(n) is electrically coupled to the reference potential XDONB. The switch unit 19 is electrically coupled between the node Q(n) and the node P(n), receives the gate high potential VGH, and is configured to prevent a voltage at the node Q(n) from back flowing to the node P(n). The electricity leakage preventing unit 20 is electrically coupled to the output end OUT2, the node P(n), and the voltage stabilization unit 18, and is configured to prevent electricity leakage of the output end OUT2 that affects output of the scanning signal ST(n). The resetting unit 21 is electrically coupled to the voltage stabilization unit 18 and receives a reset signal RST.

Implementation manners of the output unit 11, the output unit 12, the input signal selection unit 13, the pull-down unit 14, the pull-down unit 15, the voltage coupling unit 16, the voltage boosting unit 17, the voltage stabilization unit 18, the switch unit 19, the electricity leakage preventing unit 20, and the resetting unit 21 are continuously described in the following. Refer to FIG. 1 again. The output unit 11 includes a transistor 111 (that is, the driving transistor). A first end of the transistor 111 is configured to receive the clock signal HC1, a second end of the transistor 111 is electrically coupled to the output end OUT1, and a control end of the transistor 111 is electrically coupled to the node Q(n). The output unit 12 includes a transistor 121. A first end of the transistor 121 is configured to receive the clock signal HC1, a second end of the transistor 121 is electrically coupled to the output end OUT2, and a control end of the transistor 121 is electrically coupled to the node Q(n).

The input signal selection unit 13 includes transistors 131 and 132. A first end of the transistor 131 is electrically coupled to the high-level voltage U2D, a second end of the transistor 131 is electrically coupled to the node P(n), and a control end of the transistor 131 is electrically coupled to the scanning signal ST(n−1). A second end of the transistor 132 is electrically coupled to the low-level voltage D2U, a first end of the transistor 132 is electrically coupled to the node P(n), and a control end of the transistor 132 is electrically coupled to the scanning signal ST(n+1).

The pull-down unit 14 includes a transistor 141. A first end of the transistor 141 is electrically coupled to the output end OUT1, a second end of the transistor 141 is electrically coupled to the reference potential XDONB, and a control end of the transistor 141 is electrically coupled to the voltage stabilization unit 18. The pull-down unit 15 includes a transistor 151. A first end of the transistor 151 is electrically coupled to the output end OUT2, a second end of the transistor 151 is electrically coupled to the reference potential XDONB, and a control end of the transistor 151 is electrically coupled to the voltage stabilization unit 18.

The voltage coupling unit 16 includes a transistor 161. A first end and a second end of the transistor 161 are both electrically coupled to the output end OUT2, and a control end of the transistor 161 is electrically coupled to the node Q(n). In another deformation embodiment, the voltage coupling unit 16 may also be implemented by using a capacitor. The voltage boosting unit 17 includes transistors 171, 172, and 173. A first end of the transistor 171 is configured to receive the gate high potential VGH, and a control end of the transistor 171 is configured to receive a signal of the node Q(n−1) of the shift register at the (n−1)$^{th}$ stage. A first end of the transistor 172 is electrically coupled to a second end of the transistor 171, a second end of the transistor 172 is electrically coupled to the preset potential XDONB_2, and a control end of the transistor 172 is configured to receive the clock signal HC1. A first end of the transistor 173 is electrically coupled to the output end OUT1, a second end of the transistor 173 is electrically coupled to the preset potential XDONB_2, and a control end of the transistor 173 is electrically coupled to the second end of the transistor 171 and the first end of the transistor 172.

The voltage stabilization unit 18 includes transistors 181, 182, and 183 and a resistor 184. A first end of the transistor 181 is configured to receive the gate high potential VGH, and a control end of the transistor 181 is configured to receive the clock signal HC3. A second end of the transistor 182 is electrically coupled to the reference potential XDONB, and a control end of the transistor 182 is electrically coupled to the node P(n). A first end of the transistor 183 is electrically coupled to the node P(n), a second end of the transistor 183 is electrically coupled to the reference potential XDONB, and a control end of the transistor 183 is electrically coupled to the first end of the transistor 182. The resistor 184 is electrically coupled between the second end of the transistor 181 and the first end of the transistor 182.

The switch unit 19 includes a transistor 191. A first end of the transistor 191 is electrically coupled to the node Q(n), a second end of the transistor 191 is electrically coupled to the node P(n), and a control end of the transistor 191 is configured to receive the gate high potential VGH. The electricity leakage preventing unit 20 includes a transistor 192. A first end and a control end of the transistor 192 are both electrically coupled to the output end OUT2, and a second end of the transistor 192 is electrically coupled to the node P(n). The resetting unit 21 includes a transistor 193. A first end and a control end of the transistor 193 are both configured to receive the reset signal RST, and a second end of the transistor 193 is electrically coupled to the control end of the transistor 183 of the voltage stabilization unit 18.

Figure 2:
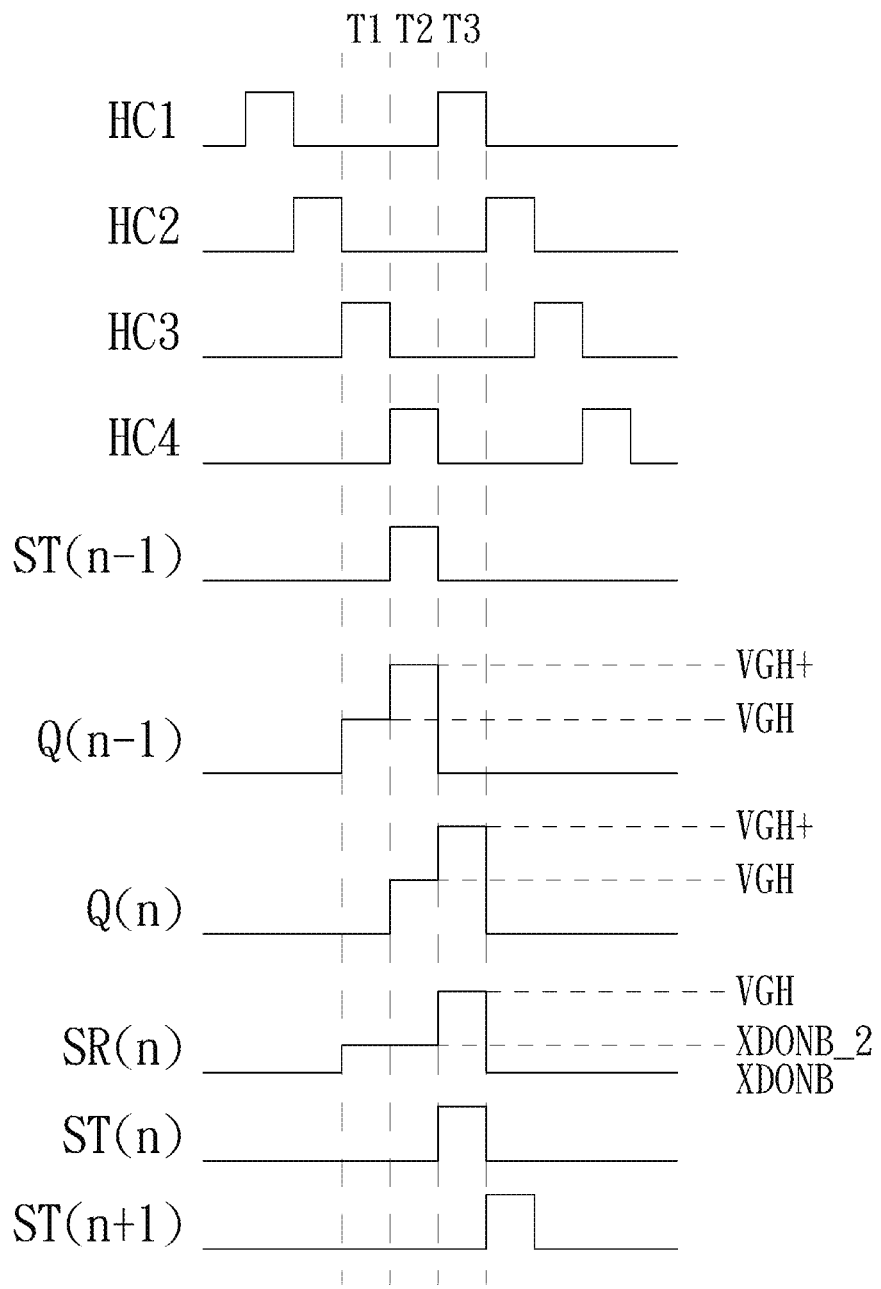
FIG. 2 is a signal timing diagram of the shift register according to the first embodiment of the present invention.

FIG. 2 is a signal timing diagram of the shift register according to the first embodiment of the present invention. In FIG. 2, reference numerals same as those in FIG. 1 represent same signals as in FIG. 1. Some operations of the shift register 100 shown in FIG. 1 are described by using three time segments (a time segment T1 to a time segment T3) shown in FIG. 2. Refer to both FIG. 1 and FIG. 2.

In the time segment T1, the transistor 171 is turned on by using a signal of the node Q(n−1) of the shift register at the (n−1)$^{th}$ stage, and the transistor 173 is turned on by using the gate high potential VGH. Therefore, the level of the gate driving signal SR(n) may pull up from the reference potential XDONB to the preset potential XDONB_2 by using the transistor 173. In the time segment T2, the transistors 171 and 173 are continuously on, and the transistor 131 is turned on by using the scanning signal ST(n−1) of the shift register at the (n−1)$^{th}$ stage, so as to further pull up the level of the node Q(n) to the high-level voltage U2D, so that the transistors 111 and 121 are both in an on state. In this embodiment, the high-level voltage U2D is implemented by using the gate high potential VGH. In the time segment T3, the clock signal HC1 is converted from a low level to a high level, and the high level is also the gate high potential VGH. Because the transistors 111 and 121 are still in an on state in this case, a pulse in the clock signal HC1 may be transmitted to the output end OUT2 by using the transistor 121, to form the scanning signal ST(n), and the node Q(n) may be coupled to a high level VGH by using the transistor 161. In addition, because the transistor 111 is still in an on state in this case, a pulse in the clock signal HC1 may be transmitted to the output end OUT1 by using the transistor 111, so as to pull up the gate driving signal SR(n) from the preset potential XDONB_2 to the gate high potential VGH.

It can be known from the foregoing descriptions that because when outputting the gate driving signal SR(n), the shift register 100 steps up the level of the gate driving signal SR(n), thereby lowering a cross voltage that a gate-source of a driving transistor (that is, the transistor 111) bears. Therefore, when the shift register 100 outputs the gate driving signal SR(n) having a voltage difference high enough, the driving transistor does not break down because the gate-source of the driving transistor does not bear an excessively high cross voltage.

Figure 3:
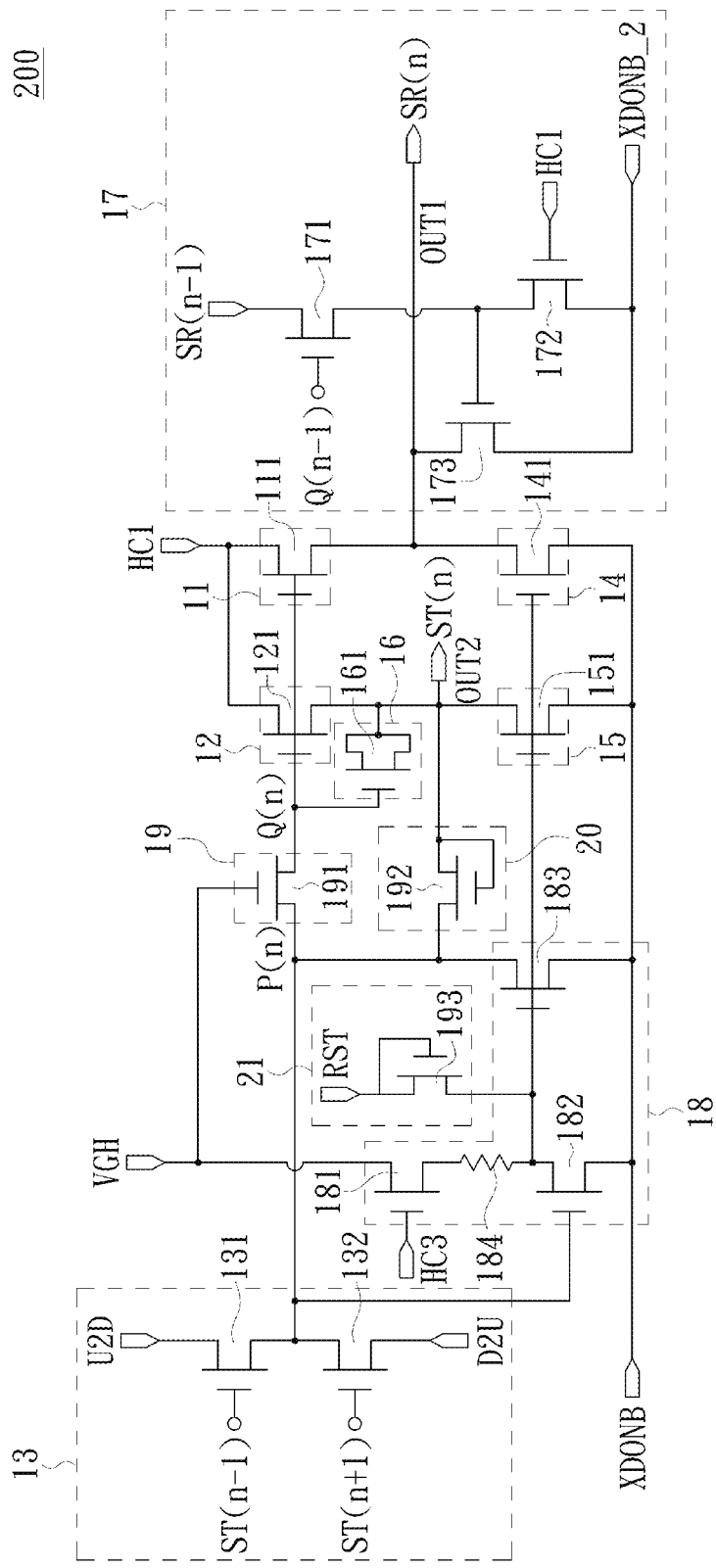
FIG. 3 is a circuit diagram of a shift register according to a second embodiment of the present invention.
Figure 4:
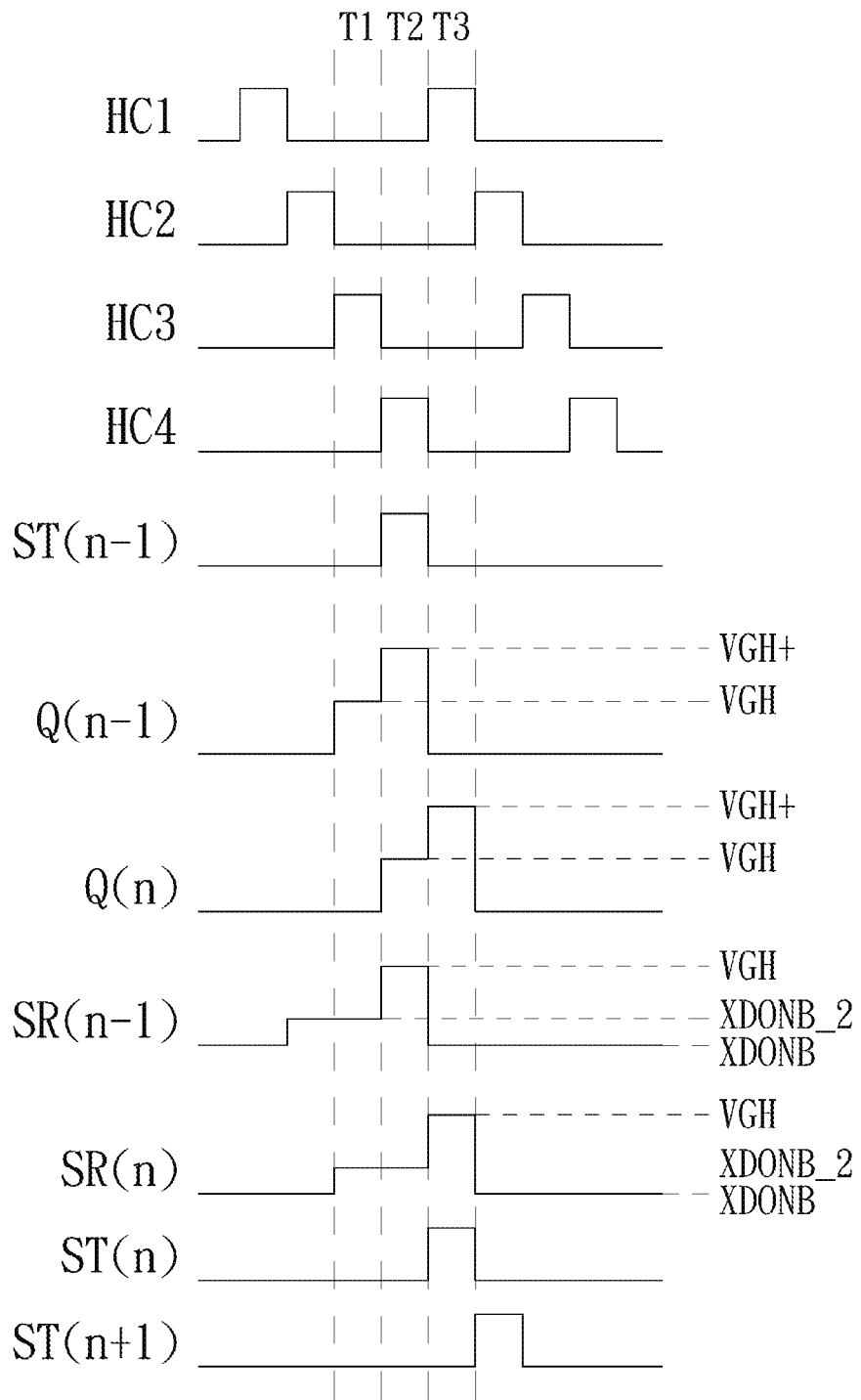
FIG. 4 is a signal timing diagram of the shift register according to the second embodiment of the present invention.

Refer to both FIG. 3 and FIG. 4. FIG. 3 and FIG. 4 are respectively a circuit diagram of and a signal timing diagram of a shift register 200 according to a second embodiment of the present invention. As shown in FIG. 3, the shift register 200 only differs from the shift register 100 in that a first end of a transistor 171 of the shift register 200 is configured to receive a gate driving signal SR(n−1) outputted by a shift register at an (n−1)$^{th}$ stage. Because an operation manner of the shift register 200 is similar to that of the shift register 100, details are not described herein.

Figure 5:
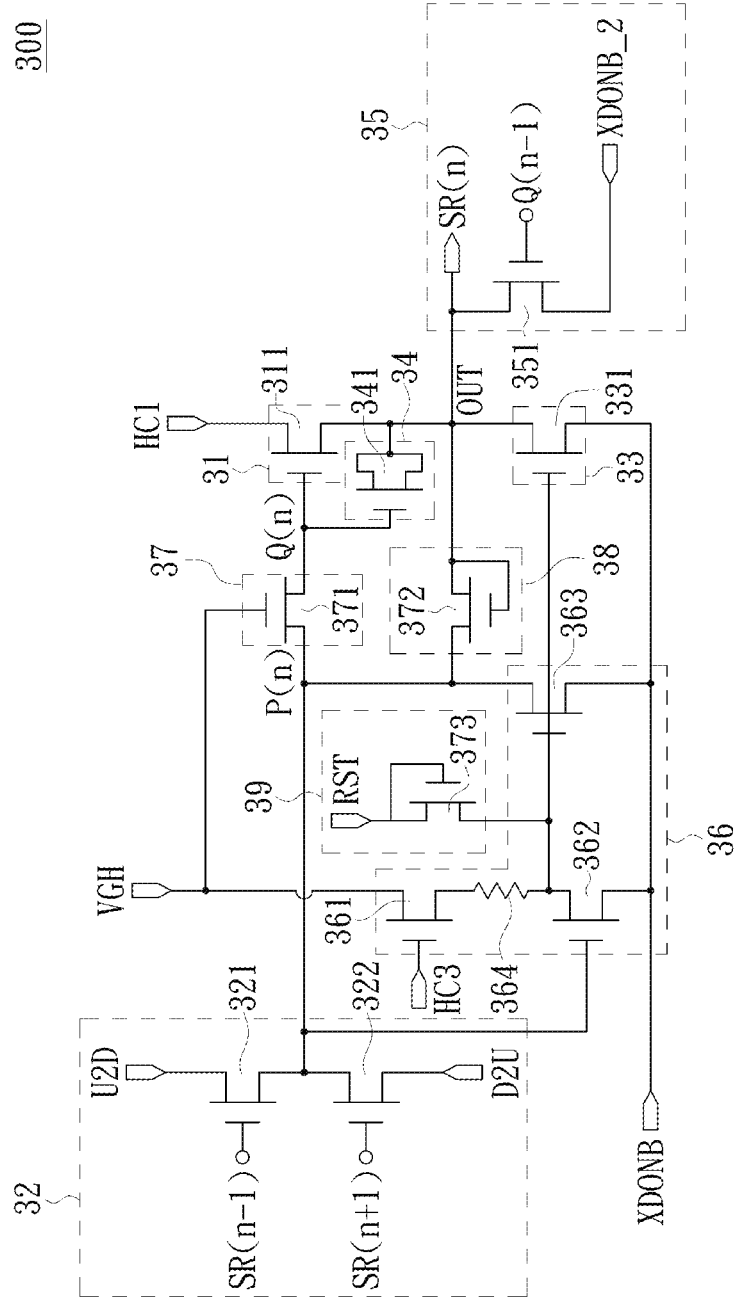
FIG. 5 is a circuit diagram of a shift register according to a third embodiment of the present invention.

Referring to FIG. 5, FIG. 5 is a circuit diagram of a shift register 300 according to a third embodiment of the present invention. As shown in FIG. 5, the shift register 300 includes an output unit 31, an input signal selection unit 32, a pull-down unit 33, a voltage coupling unit 34, a voltage boosting unit 35, a voltage stabilization unit 36, a switch unit 37, an electricity leakage preventing unit 38, and a resetting unit 39. The output unit 31 is respectively electrically coupled to a node Q(n) and an output end OUT, and receives a clock signal HC1. The output unit 31 is configured to output a gate driving signal SR(n) according to the node Q(n) and the clock signal HC1.

The input signal selection unit 32 is electrically coupled to a node P(n), and receives a gate driving signal SR(n−1) outputted by the shift register at the $(n-1)^{th}$ stage, a gate driving signal SR(n+1) outputted by a shift register at an $(n+1)^{th}$ stage, a high-level voltage U2D, and a low-level voltage D2U. The input signal selection unit 32 is configured to determine, according to the gate driving signal SR(n−1), whether the node P(n) is electrically coupled to the high-level voltage U2D and is configured to determine, according to the gate driving signal SR(n+1), whether the node P(n) is electrically coupled to the low-level voltage D2U.

The pull-down unit 33 is electrically coupled to the output end OUT and receives a reference potential XDONB. The voltage coupling unit 34 is electrically coupled between the node Q(n) and the output end OUT. The voltage boosting unit 35 is electrically coupled to a preset potential XDONB_2, the output end OUT, and a node Q(n−1) of the shift register at the $(n-1)^{th}$ stage, and is configured to, during a voltage level change period of the node Q(n−1) of the shift register at the $(n-1)^{th}$ stage, pull up the level of the gate driving signal SR(n) from the reference potential XDONB to the preset potential XDONB_2.

The voltage stabilization unit 36 is electrically coupled to the input signal selection unit 32, the gate high potential VGH, the clock signal HC3, and the reference potential XDONB. The voltage stabilization unit 36 is configured to determine, according to the clock signal HC3, whether the node P(n) is electrically coupled to the reference potential XDONB. The switch unit 37 is electrically coupled to between the node Q(n) and the node P(n), and receives the gate high potential VGH. The switch unit 37 is configured to prevent a voltage of the node Q(n) from back flowing to the node P(n). The electricity leakage preventing unit 38 is electrically coupled to the output end OUT, the node P(n), and the voltage stabilization unit 36. The resetting unit 39 is electrically coupled to the voltage stabilization unit 36 and receives a reset signal RST.

Implementation manners of the output unit 31, the input signal selection unit 32, the pull-down unit 33, the voltage coupling unit 34, the voltage boosting unit 35, the voltage stabilization unit 36, the switch unit 37, the electricity leakage preventing unit 38, and the resetting unit 39 are continuously described in the following. Refer to FIG. 5 again. The output unit 31 includes a transistor 311 (that is, the driving transistor). A first end of the transistor 311 is configured to receive the clock signal HC1, a second end of the transistor 311 is electrically coupled to the output end OUT, and a control end of the transistor 311 is electrically coupled to the node Q(n).

The input signal selection unit 32 includes transistors 321 and 322. A first end of the transistor 321 is electrically coupled to the high-level voltage U2D, a second end of the transistor 321 is electrically coupled to the node P(n), and a control end of the transistor 321 is electrically coupled to the gate driving signal SR(n−1) outputted by the shift register at the $(n-1)^{th}$ stage. A second end of the transistor 322 is electrically coupled to the low-level voltage D2U, a first end of the transistor 322 is electrically coupled to the node P(n), and a control end of the transistor 322 is electrically coupled to the gate driving signal SR(n+1) outputted by the shift register at the $(n+1)^{th}$ stage.

The pull-down unit 33 includes a transistor 331. A first end of the transistor 331 is electrically coupled to the output end OUT, a second end of the transistor 331 is electrically coupled to the reference potential XDONB, and a control end of the transistor 331 is electrically coupled to the voltage stabilization unit 36. The voltage coupling unit 34 includes a transistor 341. A first end and a second end of the transistor 341 are both electrically coupled to the output end OUT, and a control end of the transistor 341 is electrically coupled to the node Q(n).

The voltage boosting unit 35 includes a transistor 351. A first end of the transistor 351 is electrically coupled to the output end OUT, a second end of the transistor 351 is electrically coupled to the preset potential XDONB_2, and a control end of the transistor 351 is configured to receive a signal of the node Q(n−1) of the shift register at the $(n-1)^{th}$ stage. The voltage stabilization unit 36 includes transistors 361, 362, and 363 and a resistor 364. A first end of the transistor 361 is configured to receive the gate high potential VGH, and a control end of the transistor 361 is configured to receive the clock signal HC3. A second end of the transistor 362 is electrically coupled to the reference potential XDONB, and a control end of the transistor 362 is electrically coupled to the node P(n). A first end of the transistor 363 is electrically coupled to the node P(n), a second end of the transistor 363 is electrically coupled to the reference potential XDONB, and a control end of the transistor 363 is electrically coupled to the first end of the transistor 362. The resistor 364 is electrically coupled between the second end of the transistor 361 and the first end of the transistor 362.

The switch unit 37 includes a transistor 371. A first end of the transistor 371 is electrically coupled to the node Q(n), a second end of the transistor 371 is electrically coupled to the node P(n), and a control end of the transistor 371 is configured to receive the gate high potential VGH. The electricity leakage preventing unit 38 includes a transistor 372. A first end and a control end of the transistor 372 are both electrically coupled to the output end OUT, and a second end of the transistor 372 is electrically coupled to the node P(n). The resetting unit 39 includes a transistor 373. A first end and a control end of the transistor 373 are both configured to receive the reset signal RST, and a second end of the transistor 373 is electrically coupled to the control end of the transistor 363 of the voltage stabilization unit 36.

Figure 6:
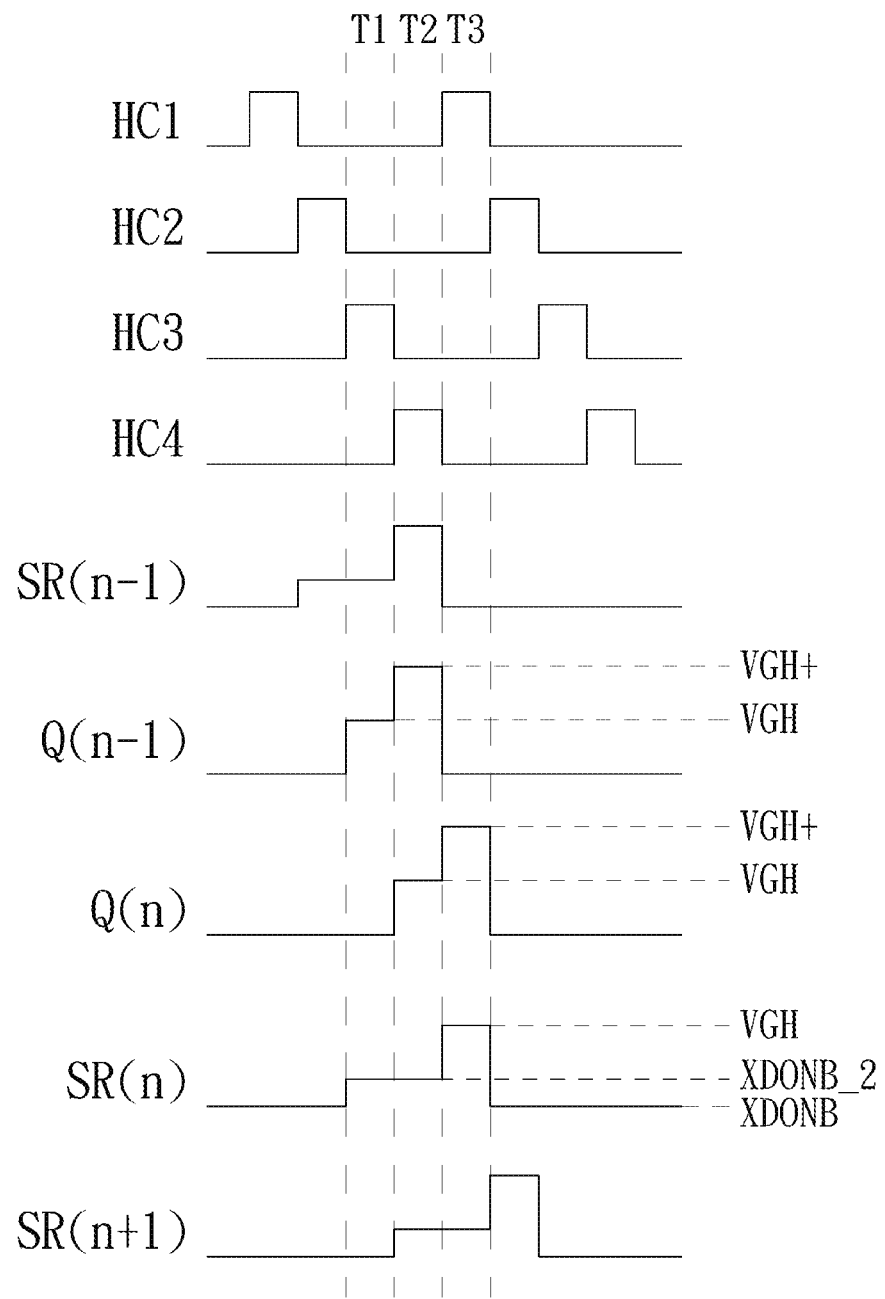
FIG. 6 is a signal timing diagram of the shift register according to the third embodiment of the present invention.

FIG. 6 is a signal timing diagram of the shift register according to the third embodiment of the present invention. In FIG. 6, reference numerals same as those in FIG. 5 represent same signals as in FIG. 1. Some operations of the shift register shown in FIG. 5 are described by using three time segments (a time segment T1 to a time segment T3) shown in FIG. 6. Refer to both FIG. 5 and FIG. 6.

In the time segment T1, the transistor 351 is turned on by using a signal of the node Q(n−1) of the shift register at the $(n-1)^{th}$ stage, so as to further pull up the level of the gate driving signal SR(n) from the reference potential XDONB to the preset potential XDONB_2. In the time segment T2, the transistor 351 is continuously on, and the transistor 321 is turned on by using the gate driving signal SR(n−1) of the shift register at the (n−1)$^{th}$ stage, so as to further pull up the level of the node Q(n) to the high-level voltage U2D, so that the transistor 311 is in an on state. In this embodiment, the high-level voltage U2D is implemented by using the gate high potential VGH. In the time segment T3, the clock signal HC1 is converted from a low level to a high level, and the high level is also the gate high potential VGH. Because the transistor 311 is still in an on state in this case, a pulse in the clock signal HC1 may be transmitted to the output end OUT by using the transistor 311, to pull up the gate driving signal SR(n) from the preset potential XDONB_2 to the gate high potential VGH, and the node Q(n) may be coupled to a high level VGH by using the transistor 341.

It can be known from the foregoing descriptions that because when outputting the gate driving signal SR(n), the shift register 300 steps up the level of the gate driving signal SR(n), thereby lowering a cross voltage that a gate-source of a driving transistor (that is, the transistor 311) bears. Therefore, when the shift register 300 outputs the gate driving signal SR(n) having a voltage difference high enough, the driving transistor does not break down because the gate-source of the driving transistor does not bear an excessively high cross voltage.

Figure 7:
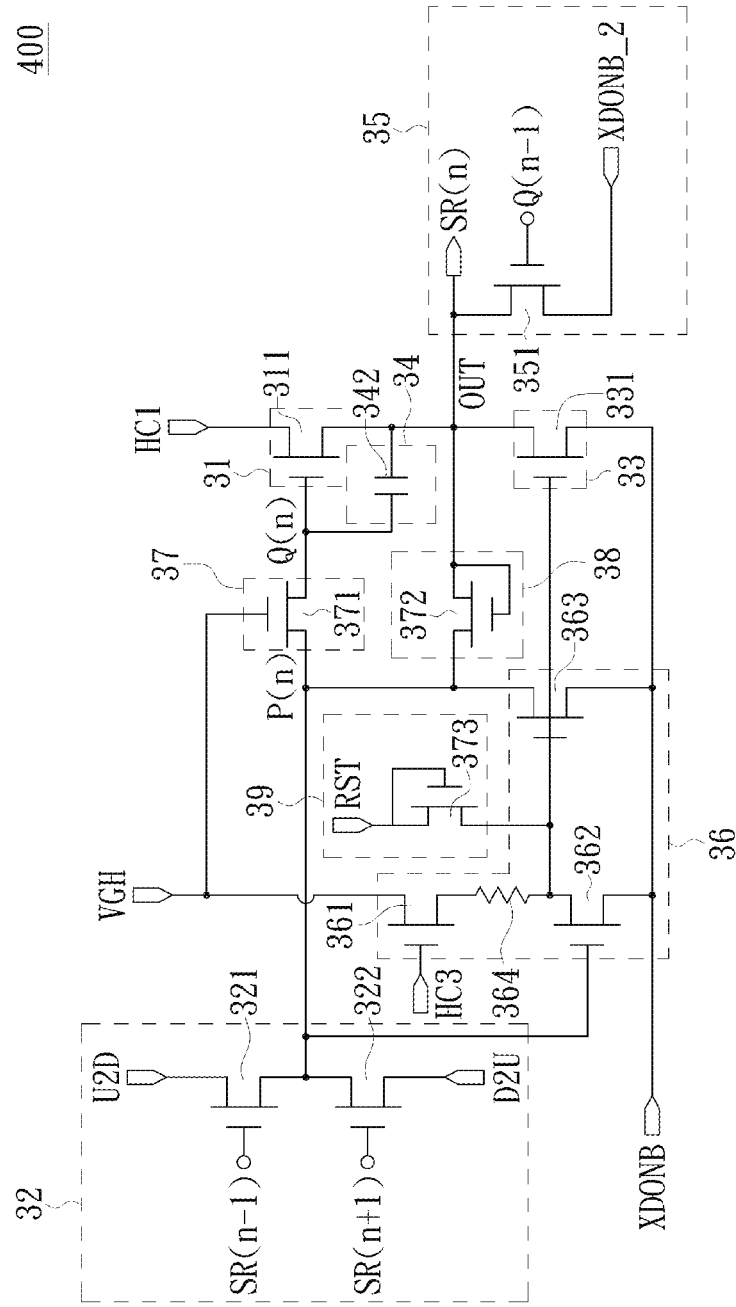
FIG. 7 is a circuit diagram of a shift register according to a fourth embodiment of the present invention.

Referring to FIG. 7, FIG. 7 is a circuit diagram of a shift register 400 according to a fourth embodiment of the present invention. As shown in FIG. 7, the shift register 400 only differs from the shift register 300 in that a voltage coupling unit 34 of the shift register 400 is implemented by using a capacitor 342. Because an operation manner of the shift register 400 is similar to that of the shift register 300, details are not described herein.

Figure 8:
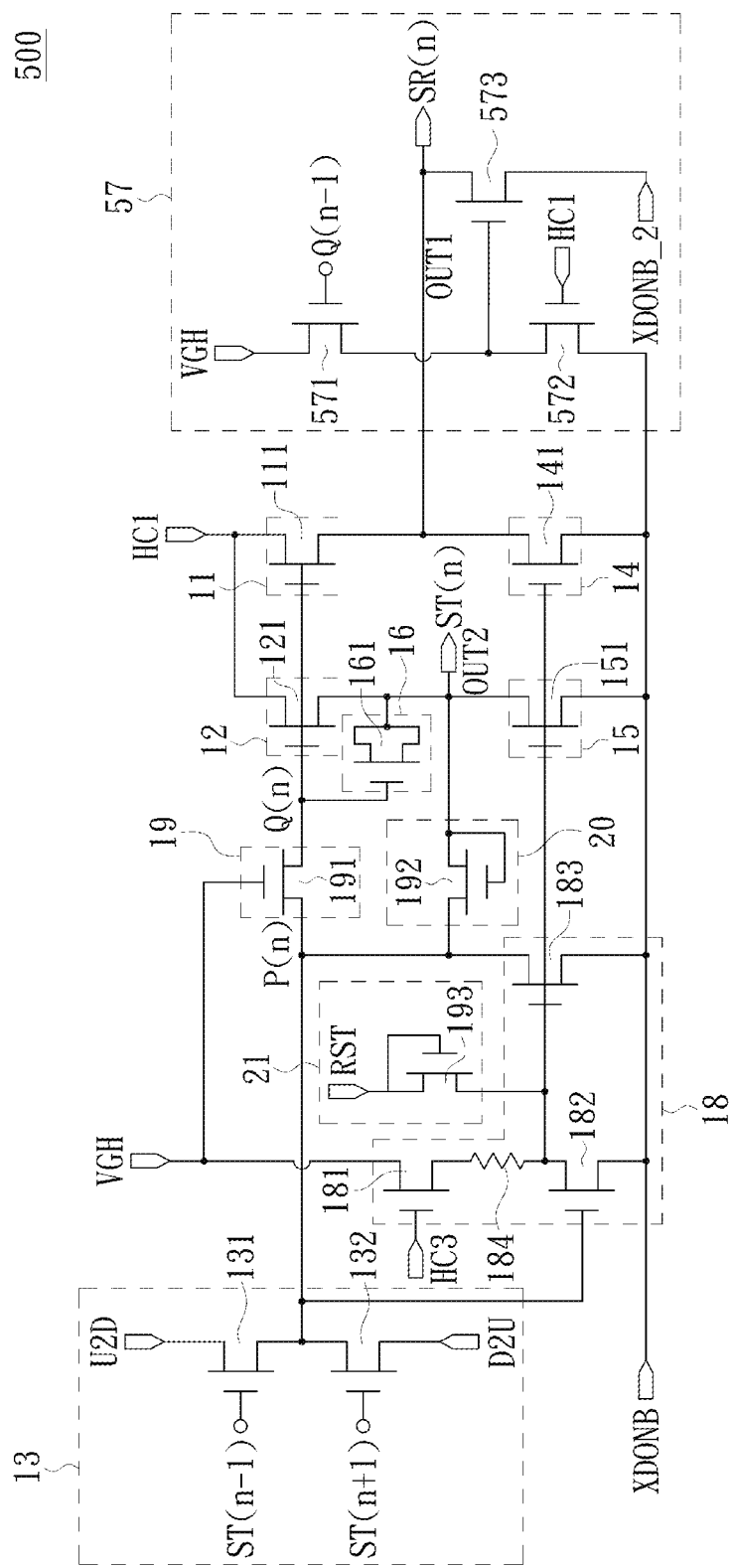
FIG. 8 is a circuit diagram of a shift register according to a fifth embodiment of the present invention.

Referring to FIG. 8, FIG. 8 is a circuit diagram of a shift register 500 according to a fifth embodiment of the present invention. As shown in FIG. 8, the shift register 500 includes an output unit 11, an output unit 12, an input signal selection unit 13, a pull-down unit 14, a pull-down unit 15, a voltage coupling unit 16, a voltage boosting unit 57, a voltage stabilization unit 18, a switch unit 19, an electricity leakage preventing unit 20, and a resetting unit 21. A circuit architecture of the shift register 500 only differs from the shift register 100 in the foregoing embodiment in a voltage boosting unit 57. Therefore, only the voltage boosting unit 57 is described herein.

The voltage boosting unit 57 is electrically coupled to a preset potential XDONB_2, a reference potential XDONB, an output end OUT1, and a node Q(n−1) and a gate high potential VGH of a shift register at an (n−1)$^{th}$ stage. The voltage boosting unit 57 is configured to, during a voltage level change period of the node Q(n−1) of the shift register at the (n−1)$^{th}$ stage, pull up the level of a gate driving signal SR(n) from the reference potential XDONB to the preset potential XDONB_2.

An implementation manner of the voltage boosting unit 57 is continuously described. Refer to FIG. 8 again. The voltage boosting unit 57 includes transistors 571, 572, and 573. A first end of the transistor 571 is configured to receive the gate high potential VGH, and a control end of the transistor 571 is configured to receive a signal of the node Q(n−1) of the shift register at the (n−1)$^{th}$ stage. A first end of the transistor 572 is electrically coupled to a second end of the transistor 571, a second end of the transistor 572 is electrically coupled to the reference potential XDONB, and a control end of the transistor 572 is configured to receive a clock signal HC1. A first end of the transistor 573 is electrically coupled to the output end OUT1, a second end of the transistor 573 is electrically coupled to the preset potential XDONB_2, and a control end of the transistor 573 is electrically coupled to the second end of the transistor 571 and the first end of the transistor 572.

Figure 9:
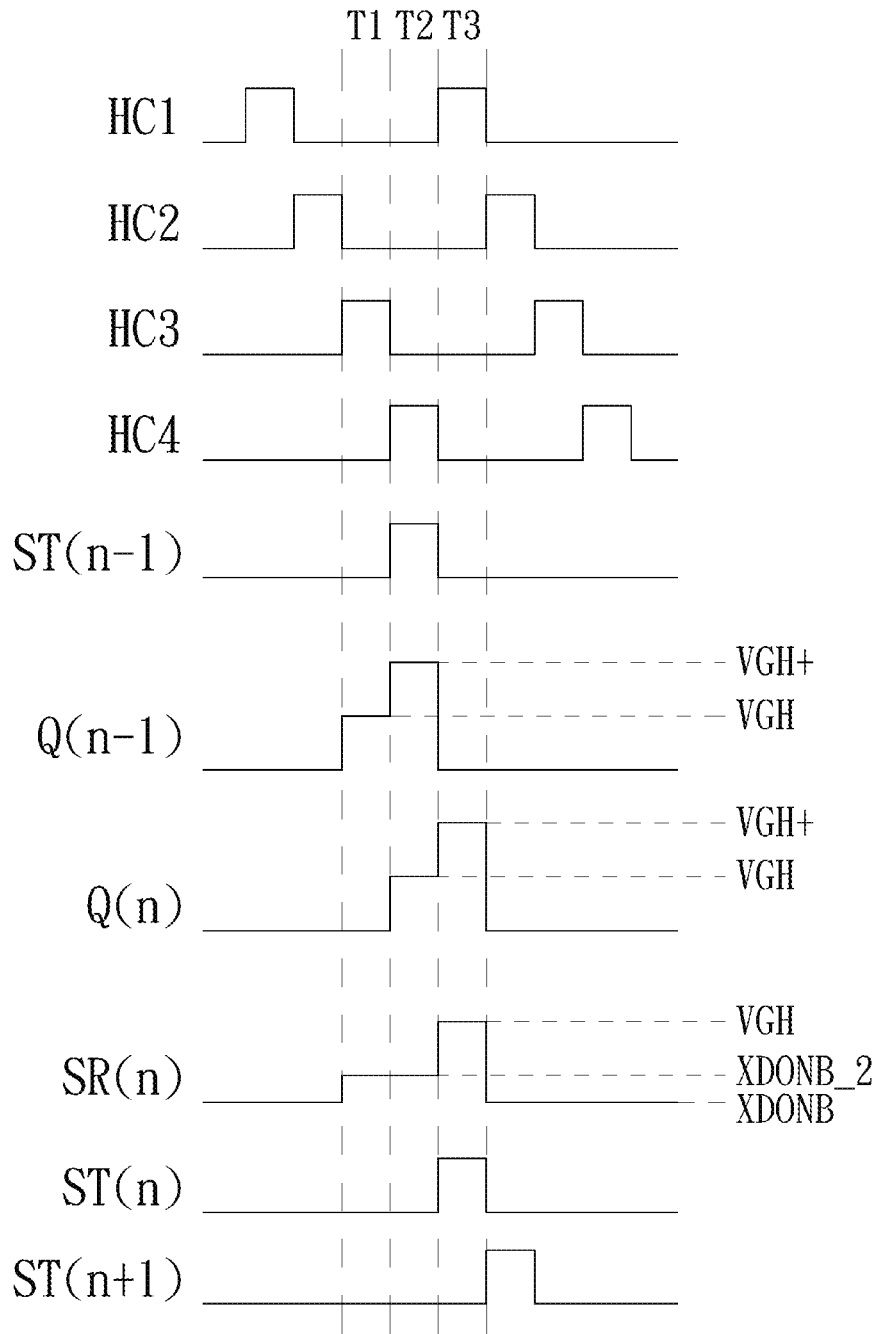
FIG. 9 is a signal timing diagram of the shift register according to the fifth embodiment of the present invention.

FIG. 9 is a signal timing diagram of the shift register according to the fifth embodiment of the present invention. In FIG. 9, reference numerals same as those in FIG. 8 represent same signals as in FIG. 1. Some operations of the shift register shown in FIG. 9 are described by using three time segments (a time segment T1 to a time segment T3) shown in FIG. 9. Refer to both FIG. 8 and FIG. 9.

In the time segment T1, the transistor 571 is turned on by using a signal of the node Q(n−1) of the shift register at the (n−1)$^{th}$ stage, and the transistor 573 is turned on by using the gate high potential VGH. Therefore, the level of the gate driving signal SR(n) may pull up from the reference potential XDONB to the preset potential XDONB_2 by using the transistor 573. In the time segment T2, the transistors 571 and 573 are continuously on, and the transistor 131 is turned on by using the scanning signal ST(n−1) of the shift register at the (n−1)$^{th}$ stage, so as to pull up the level of the node Q(n) to the high-level voltage U2D, so that the transistors 111 and 121 are both in an on state. In this embodiment, the high-level voltage U2D is implemented by using the gate high potential VGH. In the time segment T3, the clock signal HC1 is converted from a low level to a high level, and the high level is also the gate high potential VGH. Because the transistors 111 and 121 are still in an on state in this case, a pulse in the clock signal HC1 is transmitted to the output end OUT2 by using the transistor 121, to form the scanning signal ST(n), and the node Q(n) is coupled to a high level VGH by using the transistor 161. In addition, because the transistor 111 is still in an on state in this case, a pulse in the clock signal HC1 may be transmitted to the output end OUT1 by using the transistor 111, so as to pull up the gate driving signal SR(n) from the preset potential XDONB_2 to the gate high potential VGH.

It can be known from the foregoing descriptions that because when outputting the gate driving signal SR(n), the shift register 500 steps up the level of the gate driving signal SR(n), thereby lowering a cross voltage that a gate-source of a driving transistor (that is, the transistor 111) bears. Therefore, when the shift register 100 outputs the gate driving signal SR(n) having a voltage difference high enough, the driving transistor does not break down because the gate-source of the driving transistor does not bear an excessively high cross voltage.

Figure 10:
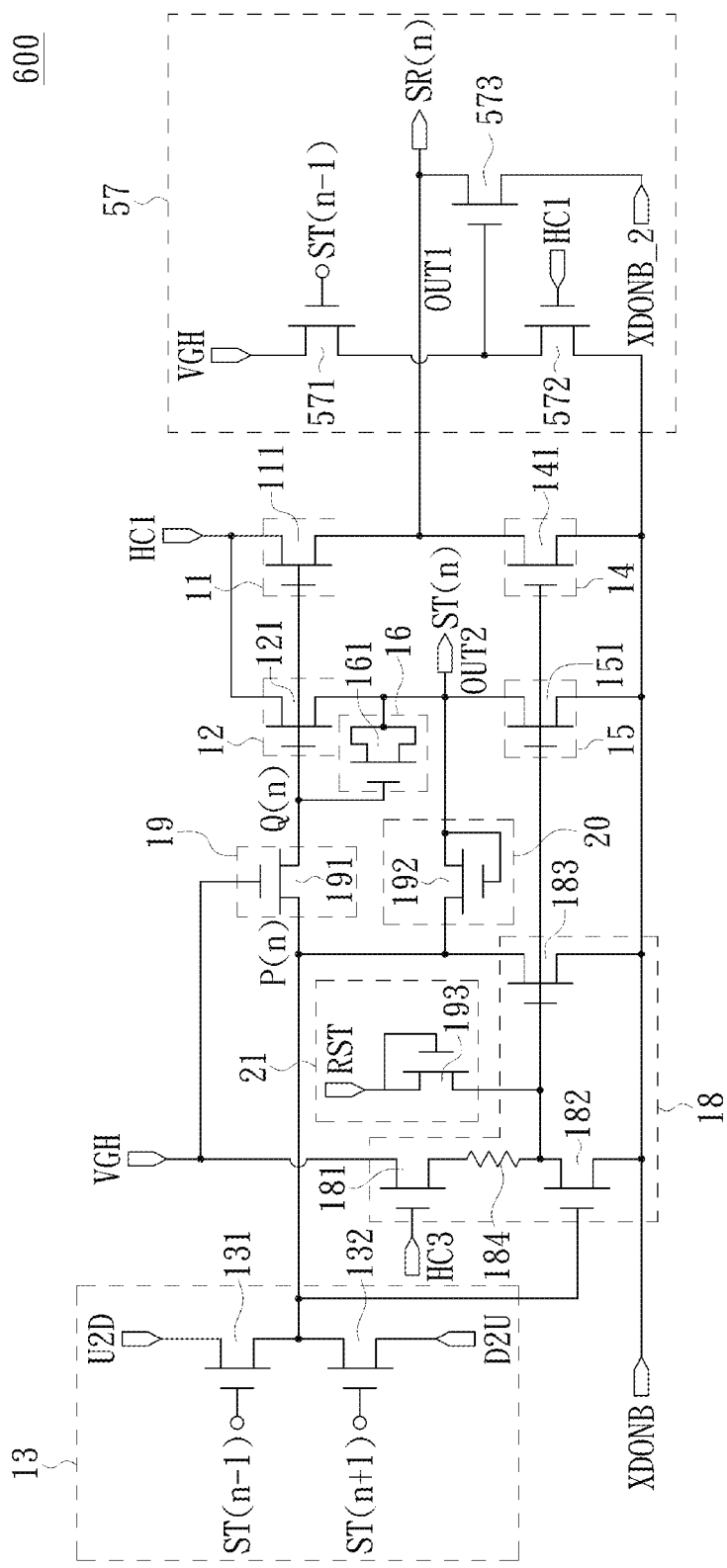
FIG. 10 is a circuit diagram of a shift register according to a sixth embodiment of the present invention.
Figure 11:
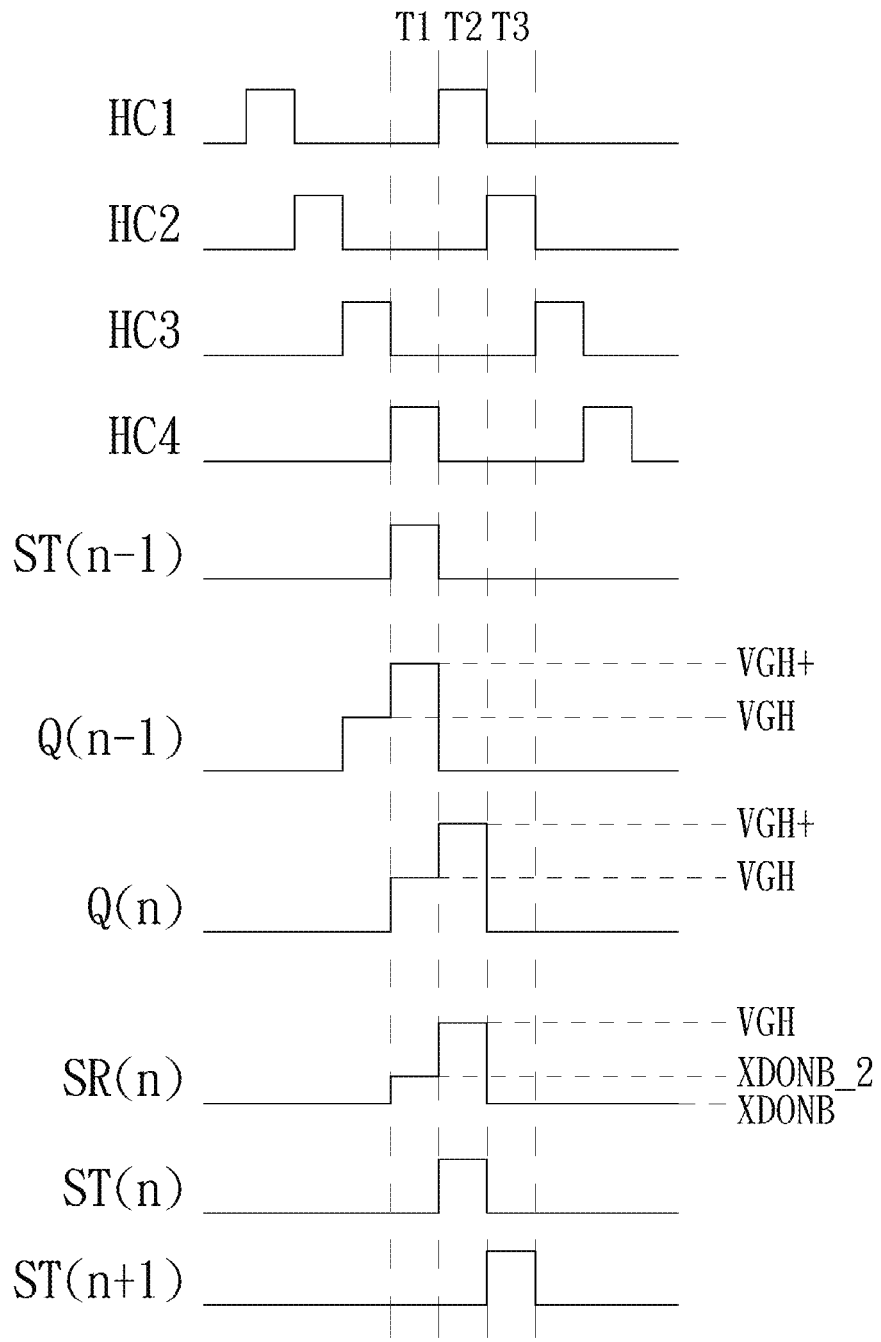
FIG. 11 is a signal timing diagram of the shift register according to the sixth embodiment of the present invention.

Refer to both FIG. 10 and FIG. 11. FIG. 10 and FIG. 11 are respectively a circuit diagram of and a signal timing diagram of a shift register 600 according to a sixth embodiment of the present invention. As shown in FIG. 10, the shift register 600 only differs from the shift register 500 in the foregoing embodiment in that a control end of a transistor 571 of the shift register 600 is configured to receive a scanning signal ST(n−1) outputted by a shift register at an (n−1)$^{th}$ stage. Because an operation manner of the shift register 600 is similar to that of the shift register 500, details are not described herein.

It should be noted that in the foregoing embodiments, the reference potential XDONB can be implemented by using a gate low level VGL. In addition, the voltage coupling unit in each of the foregoing embodiments can be implemented by using a transistor or a capacitor.

An embodiment of the present invention also provides a display apparatus, using the gate driving circuit of the present invention. The display apparatus includes an active area and a surrounding area. The active area has a plurality of gate lines and a plurality of data lines. The gate lines are staggered with the data lines to form a plurality of pixel units. The surrounding area is disposed at one side of the active area. The gate driving circuit in the foregoing embodiment may be disposed in the surrounding area and may be electrically coupled to the gate lines. In this embodiment, the gate driving circuit includes a shift register having a plurality of stages that are connected in series, and a shift register at each stage respectively includes an output end, a primary output circuit, a voltage boosting circuit, a clock signal, a gate high potential, a reference potential, and a preset potential. Referring to FIG. 1, the output end OUT1 is configured to generate the output end OUT1 to one of the gate lines. The output end OUT2 is configured to generate a scanning signal to a shift register at a previous stage or a next stage. The primary output circuit is electrically coupled to the output end OUT2, and the primary output circuit refers to a remaining part other than the voltage boosting unit 17 in the shift register at each stage. In the embodiment of FIG. 1, the primary output circuit is a circuit including an output unit 11, an output unit 12, an input signal selection unit 13, a pull-down unit 14, a pull-down unit 15, a voltage coupling unit 16, a voltage stabilization unit 18, and a switch unit 19, and a voltage boosting circuit corresponds to the voltage boosting unit 17. In this way, the primary output circuit of the shift register at each stage may include the output end OUT2 and the output end OUT1, and the voltage boosting circuit may be electrically coupled to the output end OUT1, so that the primary output circuit may be electrically coupled to the voltage boosting circuit by using the output end OUT1. Therefore, the gate driving signal SR(n) of the output end OUT1 is affected by the primary output circuit and the voltage boosting circuit.

In this embodiment, clock signals (such as clock signals HC1, HC2, HC3, and HC4) are respectively electrically coupled to the primary output circuit and the voltage boosting circuit. That is, the primary output circuit and the voltage boosting circuit may respectively receive the clock signals. Similarly, the gate high potential is respectively electrically coupled to the primary output circuit and the voltage boosting circuit, so that the primary output circuit and the voltage boosting circuit may respectively receive the gate high potential. In addition, the reference potential XDONB is electrically coupled to the primary output circuit. The preset potential XDONB_2 is electrically coupled to the voltage boosting circuit, so that the primary output circuit may receive the reference potential XDONB, and the voltage boosting circuit may receive the preset potential XDONB_2. In addition, in this embodiment, the preset potential XDONB_2 is higher than the reference potential XDONB, and the preset potential XDONB_2 is lower than the gate high potential VGH. In this way, the shift register at each stage may receive two groups of low-level signals having different levels. A low level is the reference potential XDONB, and the other level is the preset potential XDONB_2. Two low levels are respectively correspondingly inputted to the primary output circuit and the voltage boosting circuit. A design different from a previous design that a shift register at each stage receives only a group of low levels can assist in application to a display apparatus with a high resolution, in an environment of a low temperature, or the like. Specifically, during a period, the level of the gate driving signal SR(n) is stepped up from the reference potential XDONB to the preset potential XDONB_2, and then from the preset potential XDONB_2 to the gate high potential VGH.

In conclusion, in the gate driving circuit of the embodiments of the present invention, when outputting a gate driving signal, a shift register at each stage first pulls up the level of the gate driving signal from a reference potential to a preset potential by using a voltage boosting unit, and then pulls up the level of the gate driving signal from the preset potential to a gate high potential. The shift register at each stage steps up the level of the gate driving signal when outputting the gate driving signal, thereby lowering a cross voltage that a gate-source of a driving transistor bears. Therefore, when the shift register at each stage outputs the gate driving signal having a voltage difference high enough, the driving transistor does not break down because the gate-source of the driving transistor does not bear an excessively high cross voltage. In addition, it can be known from the descriptions of the foregoing embodiments that the gate driving circuit of the present invention can be applied to a display apparatus that needs a high frame rate, for example, a display apparatus for eSports, or can be applied to a low temperature environment that needs a high cross voltage, for example, a display apparatus for vehicles.

Although the present invention is disclosed as above by using the embodiments, the embodiments are not intended to limit the present invention. A person of ordinary skill in the art may make variations and improvements without departing from the spirit and scope of the present invention. Therefore, the protection scope of the present invention should be subject to the appended claims.

What is claimed is:

1. A gate driving circuit, comprising:
   a shift register having a plurality of stages connected in series, wherein the shift register at each stage respectively comprises a first output end for outputting a gate driving signal and a second output end for outputting a scanning signal, and receives a clock signal, a reference potential, a preset potential, and a gate high potential, and the shift register at each stage comprises:
   a first output unit, respectively electrically coupled to a node and the first output end, receiving the clock signal, and outputting the gate driving signal according to the node and the clock signal;
   a first pull-down unit, respectively electrically coupled to the first output end and receiving the reference potential;
   a second output unit, respectively electrically coupled to the node and the second output end, receiving the clock signal, and outputting the clock signal according to the node and the clock signal;
   a second pull-down unit, respectively electrically coupled to the second output end and the reference potential;
   a voltage coupling unit, respectively electrically coupled between the node and the second output end; and
   a voltage boosting unit, respectively electrically coupled to the preset potential, the first output end, and one of node of a shift register at as previous stage and an output of the shift register at the previous stage;
   wherein during a voltage level change period of the scanning signal outputted by the shift register at the previous stage, the level of the gate driving signal pulls up from the reference potential to the preset potential, and the preset potential is lower than the gate high potential.

2. The gate driving circuit according to claim 1, wherein the voltage boosting unit comprises:
   a first transistor, having a first end, a second end, and a first control end, wherein the first end receives the gate high potential, and the first control end is electrically coupled to the second output end of the shift register at the previous stage;

a second transistor, having a third end, a fourth end, and a second control end, wherein the third end is electrically coupled to the second end, the fourth end receives the reference potential, and the second control end receives the clock signal; and a third transistor, having a fifth end, a sixth end, and a third control end, wherein the fifth end is electrically coupled to the first output end, the sixth end receives the preset potential, and the third control end is electrically coupled to the second end.

3. A gate driving circuit, comprising:

a shift register having a plurality of stages connected in series, wherein a shift register at each stage respectively comprises a first output end for outputting a gate driving signal, the shift register at each stage receives a clock signal, a reference potential, a preset potential, and a gate high potential, and the shift register at each stage comprises:

a first output unit, respectively electrically coupled to a node and the first output end, receiving the clock signal, and outputs the gate driving signal from the first output end according to the node and the clock signal;

a first pull-down unit, respectively electrically coupled to the first output end and receiving the reference potential;

a voltage coupling unit, respectively electrically coupled to the node; and a voltage boosting unit, respectively electrically coupled to the preset potential, the first output end, and one of a node of a shift register at a previous stage and an output of the shift register at the previous stage;

wherein during a voltage level change period of the node of the shift register at the previous stage, the level of the gate driving signal pulls up from the reference potential to a preset potential, and the preset potential is lower than the gate high potential.

4. The gate driving circuit according to claim 3, wherein the voltage boosting unit comprises a transistor, the transistor has a first end, a second end, and a control end, the first end is electrically coupled to the first output end and the second end receives the preset potential.

5. The gate driving circuit according to claim 4, wherein the control end is electrically coupled to the node of the shift register at the previous stage.

6. The gate driving circuit according to claim 3, further comprises:

a second output unit, respectively electrically coupled to the node and a second output end, receiving the clock signal, and outputting the clock signal according to the node and the clock signal;

wherein the voltage coupling unit is electrically coupled between the node and the second output end.

7. A display apparatus, comprising:

an active area, having a plurality of gate lines and a plurality of data lines, wherein the plurality of gate lines is staggered with the plurality of data lines to form a plurality of pixel units;

a surrounding area, disposed at one side of the active area and having a gate driving circuit, wherein the gate driving circuit is respectively electrically coupled to the plurality of gate lines, the gate driving circuit comprises a shift register having a plurality of stages that are connected in series, and a shift register at each stage respectively comprises:

a first output end, for outputting a gate driving signal to one of the plurality of gate lines;

a second output end, for outputting a scanning signal to a shift register at a previous stage or a next stage;

a primary output circuit, electrically coupled to the second output end;

a voltage boosting circuit, electrically coupled to the first output end;

a first clock signal, respectively electrically coupled to the primary output unit circuit and the voltage boosting unit circuit;

a gate high potential, respectively electrically coupled to the primary output circuit and the voltage boosting circuit;

a reference potential, electrically coupled to the primary output circuit; and a preset potential, electrically coupled to the voltage boosting circuit, wherein the preset potential is higher than the reference potential, and the preset potential is lower than the gate high potential;

wherein the level of the gate driving signal is stepped up from the reference potential to the preset potential, and then from the preset potential to the gate high potential.

* * * * *